United States Patent
Yamamoto et al.

(10) Patent No.: US 7,371,489 B2
(45) Date of Patent: May 13, 2008

(54) PHOTOMASK, METHOD FOR DETECTING PATTERN DEFECT OF THE SAME, AND METHOD FOR MAKING PATTERN USING THE SAME

(75) Inventors: Tomohiko Yamamoto, Kawasaki (JP); Satoru Asai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/437,628

(22) Filed: May 22, 2006

(65) Prior Publication Data

US 2006/0210930 A1    Sep. 21, 2006

Related U.S. Application Data

(62) Division of application No. 10/367,859, filed on Feb. 19, 2003, now Pat. No. 7,074,524.

(30) Foreign Application Priority Data

Jul. 31, 2002    (JP) .............................. 2002-224037

(51) Int. Cl.
*G03F 9/00*    (2006.01)
*G03C 5/00*    (2006.01)

(52) U.S. Cl. ....................... 430/30; 430/312; 382/144; 382/145

(58) Field of Classification Search .................... 430/5, 430/30, 312; 382/144, 145
See application file for complete search history.

(56) References Cited

U.S. PATENT DOCUMENTS 5,585,210 A    12/1996    Lee et al.
5,725,973 A    3/1998    Han et al.

FOREIGN PATENT DOCUMENTS

| JP | 03-018851 | 1/1991 |
|---|---|---|
| JP | 11-260299 | 9/1999 |
| JP | 2001-141677 | 5/2001 |

OTHER PUBLICATIONS

Japanese Office Action mailed Jan. 29, 2008 for JP 2002-224037.

*Primary Examiner*—Christopher G. Young
(74) *Attorney, Agent, or Firm*—Westerman, Hattori, Daniels & Adrian, LLP.

(57) ABSTRACT

There exist a pattern-dense region where patterns having an F-letter shape are dense and a pattern-interspersed region where small rectangular dummy patterns are interspersed. In the pattern-interspersed region, the dummy patterns are arranged in a manner that at least one dummy pattern exists in a scan target range of a mask pattern defect inspecting apparatus. With the dummy patterns formed in the pattern-interspersed region at the intervals as described above, when one scan target range is scanned by the mask pattern defect inspecting apparatus, at least one dummy pattern is included in the scan target range in the pattern-interspersed region. Therefore, mix-up of alignment in this range is prevented from occurring, which makes it possible to perform proper defect inspection.

20 Claims, 13 Drawing Sheets

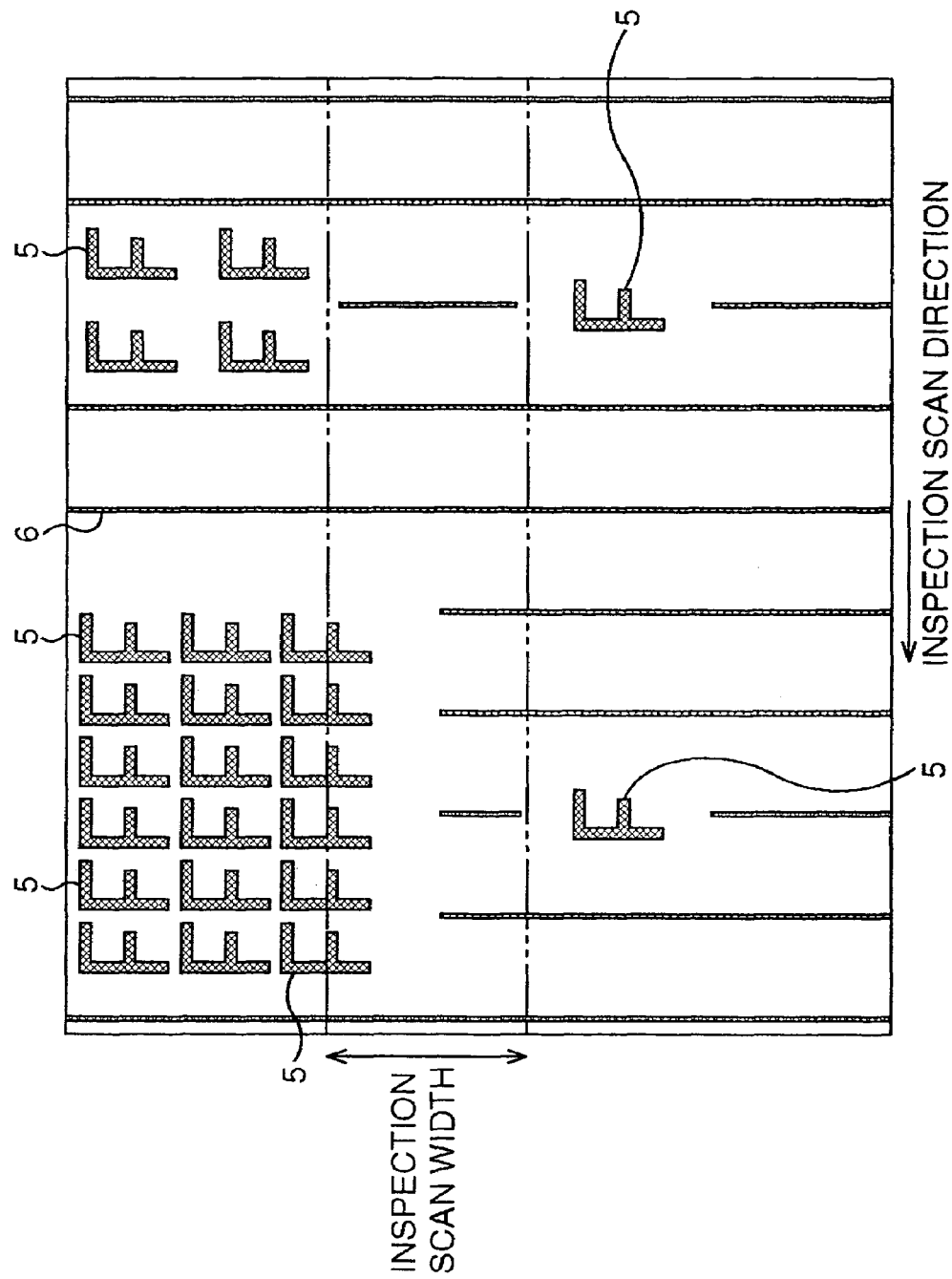

7a  7b

PHOTOMASK, METHOD FOR DETECTING PATTERN DEFECT OF THE SAME, AND METHOD FOR MAKING PATTERN USING THE SAME

CROSS-REFERENCE TO RELATED APPLICATIONS

This application is a division of application Ser. No. 10/367,859 filed Feb. 19, 2003 now U.S. Pat. No. 7,074,524, which is based upon and claims the benefit of priority from the prior Japanese Patent Application No. 2002-224037, filed on Jul. 31, 2002, the entire contents of which are incorporated herein by reference.

BACKGROUND OF THE INVENTION

1. Field of the Invention

The present invention relates to a photomask used for photolithography which is performed in manufacturing a semiconductor device, a liquid crystal display device, and the like, a method for detecting a pattern defect of the photomask, and a method for making patterns using the photomask.

2. Description of the Related Art

In manufacturing a semiconductor device, a liquid crystal display device, and the like, various kinds of patterns formed on a photomask are transferred by photolithography to a photosensitive resist formed on a substrate. After this transfer, the photosensitive resist is developed to process a wiring layer and the like with the patterns on the photosensitive resist as a mask.

Therefore, extremely high accuracy is required for the photomask. Thus, inspection of the photomask itself using a defect inspecting apparatus for the photomask, inspection of the patterns formed on the photosensitive resist by the transfer using a defect inspecting apparatus for a wafer, and the like are performed. The latter inspection is performed mainly for a photomask such as a Levenson phase shift mask whose defect cannot be guaranteed to be detected when only the pattern defect inspecting apparatus for the photomask itself is used. The defect of the photomask is detected from a defect in the patterns formed on the photosensitive resist by the transfer.

However, on the photomask used in manufacturing the semiconductor device, the liquid crystal display device, and the like, patterns such as a memory cell array, a logic circuit, and a latch circuit are formed with slight gaps therebetween. Accordingly, even in a region inside a scribe line, a region where the patterns are dense and a region where the patterns are interspersed exist irregularly. If defect inspection for inspecting whether or not the mask patterns include the defect is performed for such a photomask using an existing pattern inspecting apparatus, the existence of the defect is recognized even in a location where the defect does not exist, in some cases. This defect is sometimes called a dummy defect.

The occurrence of the dummy defect is caused by an inspection algorithm of the pattern defect inspecting apparatus. The pattern defect inspecting apparatus performs alignment of the patterns while inspecting the patterns. The alignment is indispensable processing because an extremely minute deviation exists compared with design data in the patterns formed on the photomask and the deviation is inevitable. However, if a region where the patterns do not exist at all is scanned, the alignment is not executed normally because of the aforesaid inspection algorithm, which leads to mix-up. As a result, when a scan target is shifted from such a region to a region where the patterns exist, normal patterns are recognized as the defect.

FIGS. 12A, 12B, and 13 are schematic diagrams showing a location where the dummy defect occurs. FIG. 12B substantially corresponds to a region surrounded by a circle in FIG. 12A, and FIG. 13 substantially corresponds to a region surrounded by a circle in FIG. 12B.

As shown in FIG. 12A, it is supposed that there is a photomask in which, for example, five rectangular pattern-dense regions 102a to 102e exist in a region surrounded by a scribe line 101 and no pattern exists at all between them. More specifically, as shown in FIGS. 12A and 12B, pattern-dense regions 102b and 102c are arranged side by side along a longitudinal direction of the pattern-dense region 102a and gaps having a T-letter shape exist between these three pattern-dense regions. Further, as shown in FIG. 13, patterns having an F-letter shape densely exist near a corner of the pattern-dense region 102b which is the closest to the pattern-dense regions 102a and 102c.

As shown in FIG. 12B and FIG. 13, if such a photomask is scanned for inspection in a direction from the right to the left in the drawings, mix-up of alignment does not occur and normal pattern inspection is performed during when the pattern-dense region 102c is scanned and thereafter a region between the pattern-dense regions 102c and 102b is scanned. However, when a scan region is shifted from the region between the pattern-dense regions 102c and 102b to the pattern-dense region 102b, the dummy defect occurs at a side A where the pattern initially appears as shown in FIG. 13.

The problem of the dummy defect as described above occurs not only in inspecting the patterns on the photomask itself but also in inspecting the patterns formed on the photosensitive resist by the transfer. In other words, also in a case of inspecting the defect in the patterns formed on the photosensitive resist, alignment is not normally performed when the region where no patterns exist at all is scanned, and the normal patterns are recognized as the defect when the scan target is shifted from such a region to the region where the patterns exist.

SUMMARY OF THE INVENTION

The present invention has been made taking the above-described problems in consideration, and its object is to provide a photomask capable of preventing a dummy defect from occurring to perform reliable inspection in inspecting a pattern defect, a method for detecting the pattern defect of the photomask, and a method for making patterns using the photomask.

The inventor of the present invention has thought of various forms of the invention which will be described below as a result of dedicated study.

A photomask according to a first aspect of the present invention is targeted for a photomask formed with main patterns to be transferred to photosensitive material. In this photomask, one or more sub-patterns are formed inside a rectangular region including all of said main patterns therein, and said sub-patterns are arranged in a manner that a part of at least one pattern selected from a group composed of said main patterns and said sub-patterns is included in a prescribed scan target range of a mask pattern defect inspecting apparatus used for inspecting patterns on said photomask at least in said rectangular region.

A photomask according to a second aspect of the present invention is targeted for a photomask formed with main patterns to be transferred to photosensitive material and used as one mask in multiple exposure. In this photomask, one or more sub-patterns having the size equal to or larger than the minimum size transferred to said photosensitive material are formed inside a rectangular region including all of said main patterns therein, and said sub-patterns are arranged in a manner that a part of a pattern made by transferring at least one pattern selected from a group composed of said main patterns and said sub-patterns is included in a prescribed scan target range of a photosensitive material pattern defect inspecting apparatus which is used for inspecting patterns made on said photosensitive material at least in said rectangular region.

A photomask according to a third aspect of the present invention is targeted for a photomask for multiple exposure formed with first and second masks used for exposing the same photosensitive material. First main patterns to be transferred to said photosensitive material and one or more first sub-patterns arranged inside a first rectangular region including all of said first main patterns therein are formed on said first mask. The first sub-patterns are arranged in a manner that a part of a pattern made by transferring at least one pattern selected from a group composed of said first main patterns and said first sub-patterns is included in a prescribed scan target range of a photosensitive material pattern defect inspecting apparatus which is used for inspecting patterns made on said photosensitive material at least in said first rectangular region. Further, second main patterns to be transferred to said photosensitive material and one or more second sub-patterns arranged inside a second rectangular region including all of said second main patterns therein are formed on said second mask. The second sub-patterns are arranged in a manner that a part of a pattern made by transferring at least one pattern selected from a group composed of said second main patterns and said second sub-patterns is included in a prescribed scan target range of said photosensitive material pattern defect inspecting apparatus at least in said second rectangular region, and further, patterns made on said photosensitive material by transferring said first sub-patterns are canceled.

According to these aspects of the present invention, with the existence of the sub-pattern(s), mix-up of alignment and occurrence of a dummy defect can be prevented. Therefore, it becomes possible to perform reliable inspection of a pattern defect.

BRIEF DESCRIPTION OF THE DRAWINGS

FIG. 5 is a schematic diagram showing a photomask according to a second embodiment of the present invention;

DETAILED DESCRIPTION OF THE PREFERRED EMBODIMENTS

Basic Essence of the Present Invention

The basic essence of the present invention will be first explained with reference to the attached drawings. Here, a photomask as shown in FIG. 1 will be explained as an example.

Figure 1:
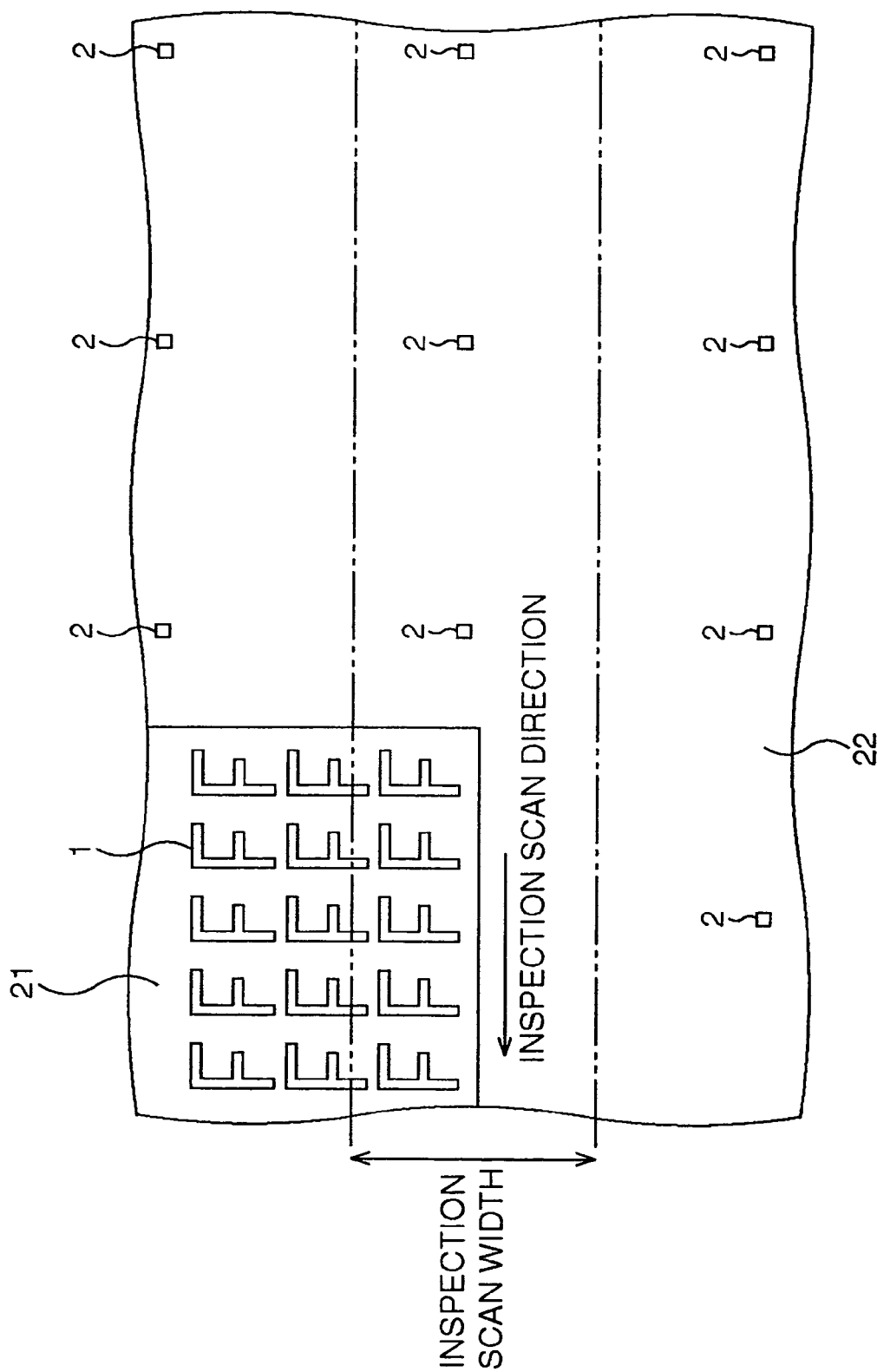
FIG. 1 is a schematic diagram showing a part of a photomask according to the present invention.
Figure 12A:
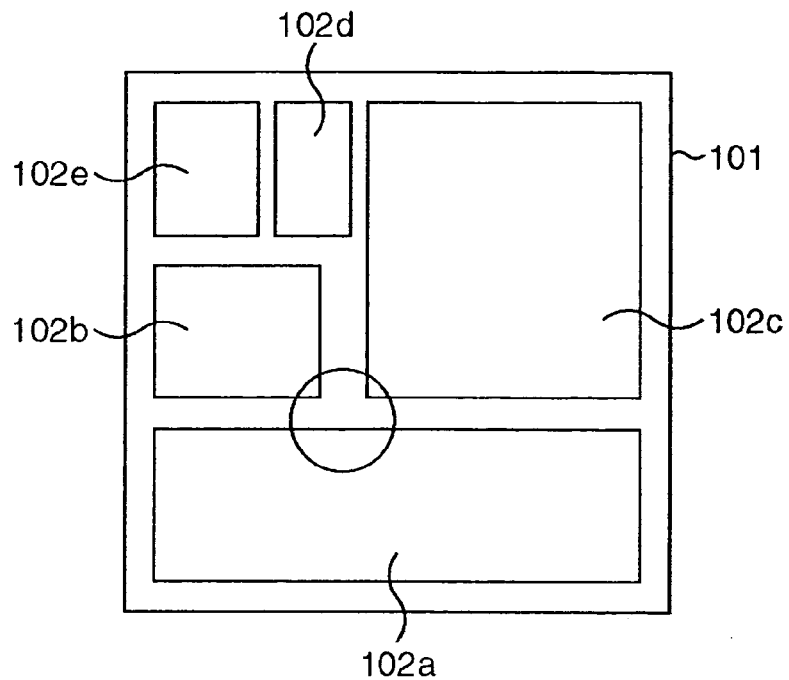
FIGS. 12A and 12B are schematic diagrams showing a position where a dummy defect occurs.
Figure 12B:
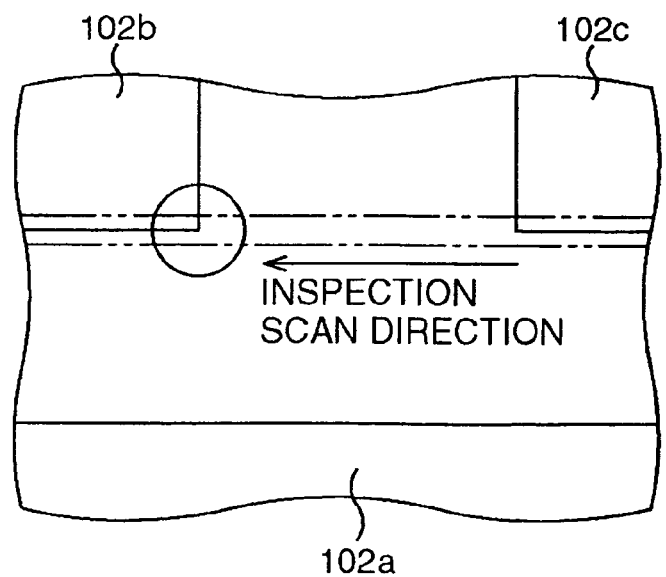
Figure 13:
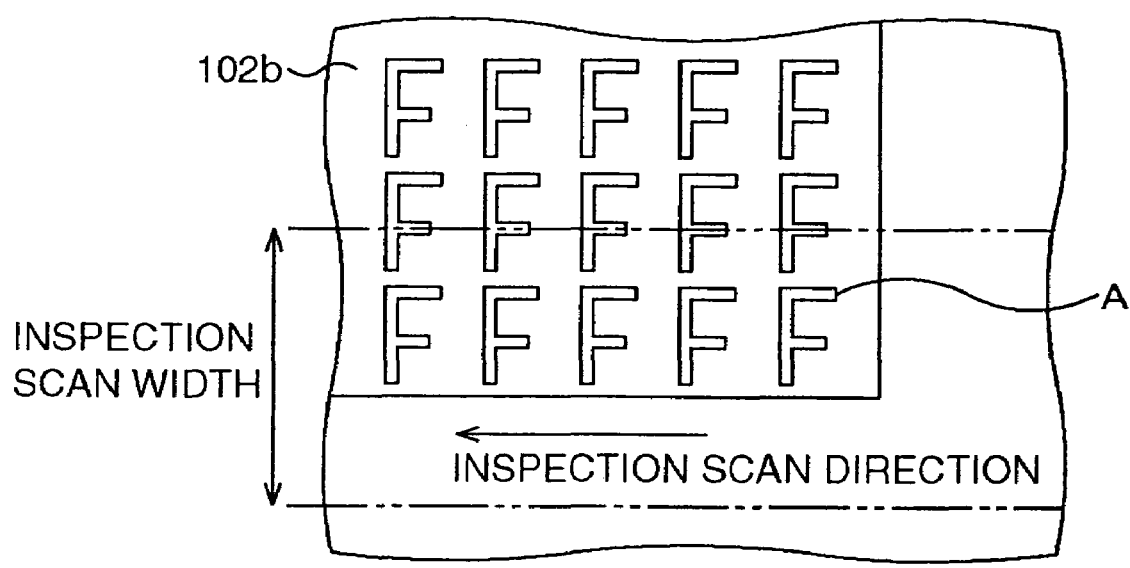
FIG. 13 is also a schematic diagram showing the position where the dummy defect occurs.

In a region of the photomask shown in FIG. 1, there exist a pattern-dense region 21 where patterns (main patterns) 1 having an F-letter shape are dense and a pattern-interspersed region 22 where small rectangular dummy patterns (sub-patterns) 2 are interspersed. The pattern-interspersed region 22 corresponds to gaps between pattern-dense regions in a photomask shown in FIGS. 12A, 12B, and 13. In the pattern-interspersed region 22, the dummy patterns 2 are arranged in a manner that at least one dummy pattern 2 exists in a scan target range of a mask pattern defect inspecting apparatus. Here, the scan target range in the present invention indicates a range regulated by the mask pattern defect inspecting apparatus or a photosensitive material pattern defect inspecting apparatus, in which data can be processed at one time in these defect inspecting apparatuses. Therefore, at least in the pattern-interspersed region 22, the dummy patterns 2 are arranged at narrower intervals than the scan width in a direction perpendicular to a scan direction of the inspection of the mask pattern defect inspecting apparatus. Further, at least in the pattern-interspersed region 22, the dummy patterns 2 are arranged at shorter intervals than the length of the scan target range of the mask pattern defect inspecting apparatus in the scan direction of the inspection of the mask pattern defect inspecting apparatus. For example, when an image is read by a CCD camera in the scan by the mask pattern defect inspecting apparatus, the scan target range is a range in which data can be transmitted at one time by the CCD camera.

Figure 2:
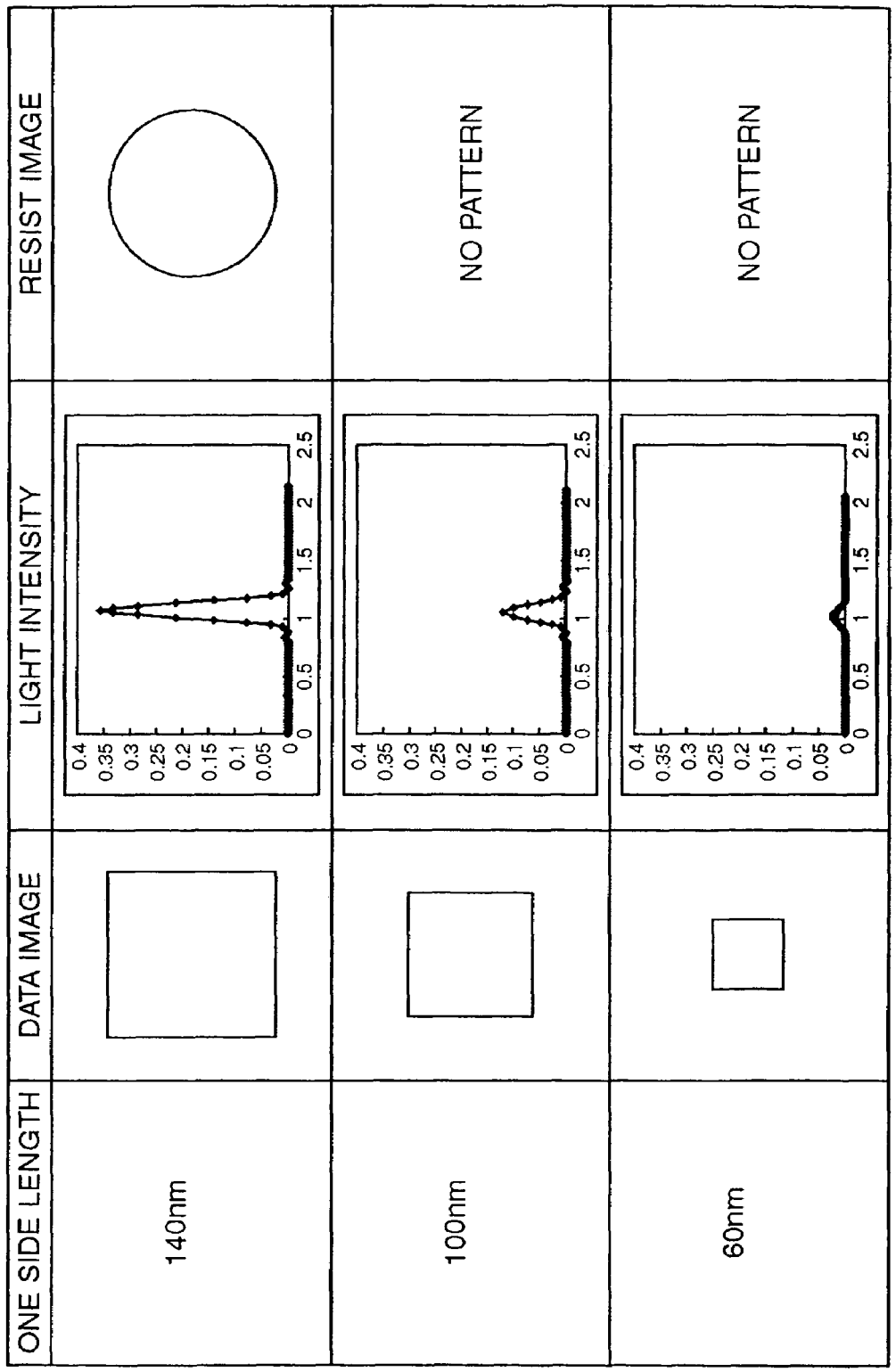
FIG. 2 is a diagram showing in a table the relationship of the size of a dummy pattern, distribution of light intensity, and shapes of pattern expected to be transferred to photosensitive material.

Hereinafter the shape of the dummy pattern 2 will be explained. The dummy pattern 2 is formed to have the size equal to or smaller than resolution. In other words, the dummy pattern 2 is formed to have the size which is not transferred to photosensitive material such as a photosensitive resist even if the photosensitive material is exposed using a photomask formed with the dummy pattern 2. FIG. 2 is a diagram showing in a table the relationship of the size of the dummy pattern, distribution of light intensity, and shapes of the pattern expected to be transferred to the photosensitive material. Incidentally, the distribution of light intensity and the shapes of the pattern shown in FIG. 2 are obtained when optical conditions except the size of the dummy pattern are equalized. Further, here, it is assumed that light intensity of approximately 0.2 is required in order to form a contact hole whose diameter is 140 nm.

As shown in FIG. 2, when one side of a square dummy pattern has the length of 140 nm, the maximum value of light intensity becomes approximately 0.35 and therefore a round pattern is transferred to the photosensitive material. On the other hand, when one side of the dummy pattern has the length of 100 nm or 60 nm, the maximum value of light intensity is approximately 0.14 or approximately 0.03 respectively, which is less than 0.2, and the pattern is not transferred to the photosensitive material.

Therefore, under the optical conditions in which light intensity distribution shown in FIG. 2 is obtained, patterns transferred to the photosensitive material are not affected even when the square dummy patterns whose one side length is approximately 100 nm are interspersed on the photomask. In other words, if the pattern has the size equal to or smaller than resolution limit, the pattern transferred to the photosensitive material is not affected.

In the case in which the dummy patterns 2 are formed at the above-described intervals in the pattern-interspersed region 22, when one scan target range is scanned by the mask pattern defect inspecting apparatus, at least one dummy pattern 2 is included in the scan target range in the pattern-interspersed region 22. Accordingly, mix-up of alignment is prevented from occurring in this range, which makes it possible to perform proper defect inspection. Moreover, at least in a rectangular region where the pattern defect is inspected, the whole region where the pattern-dense region 21 is not provided is made to be the pattern-interspersed region 22 so that dummy defect can be prevented from occurring in the defect inspection range. It should be noted that the number of the dummy patterns is not particularly limited.

Figure 3A:
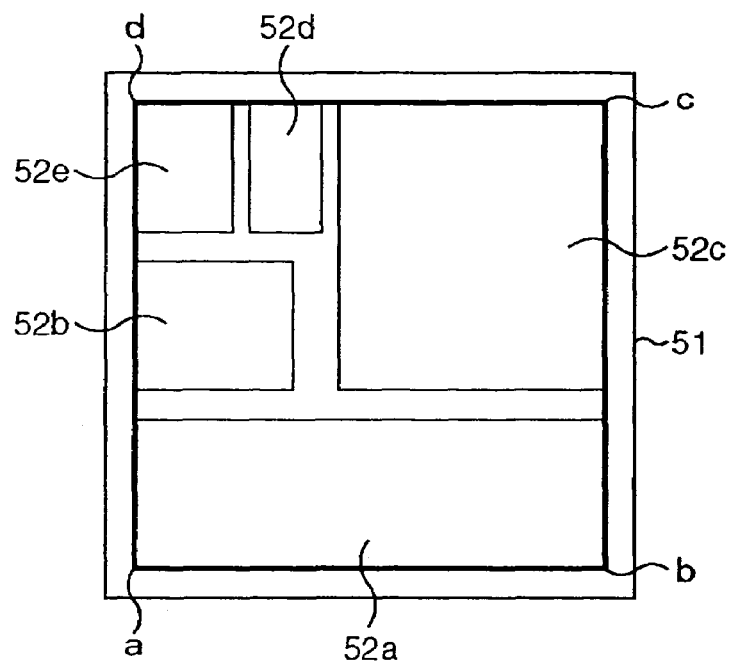
FIGS. 3A and 3B are schematic diagrams for defining a minimum rectangular region.

Here, a minimum rectangular region in the present invention will be explained. The minimum rectangular region in the present invention indicates a region having sides parallel to the scan direction of the mask pattern defect inspecting apparatus or the photosensitive material pattern defect inspecting apparatus and having the smallest area in a rectangular region including the main patterns therein. For example, as shown in FIG. 3A, when pattern-dense regions 52a to 52e exist inside a scribe line 51 and the main patterns are formed in substantially the whole of the pattern-dense regions 52a to 52e, a region surrounded by a rectangle abcd is the minimum rectangular region. On the other hand, as shown in FIG. 3B, when pattern-dense regions 52f to 52j exist inside the scribe line 51 and main patterns are formed in substantially the whole of the pattern-dense regions 52f to 52j, a region surrounded by a rectangle efgh is the minimum rectangular region.

Figure 3B:
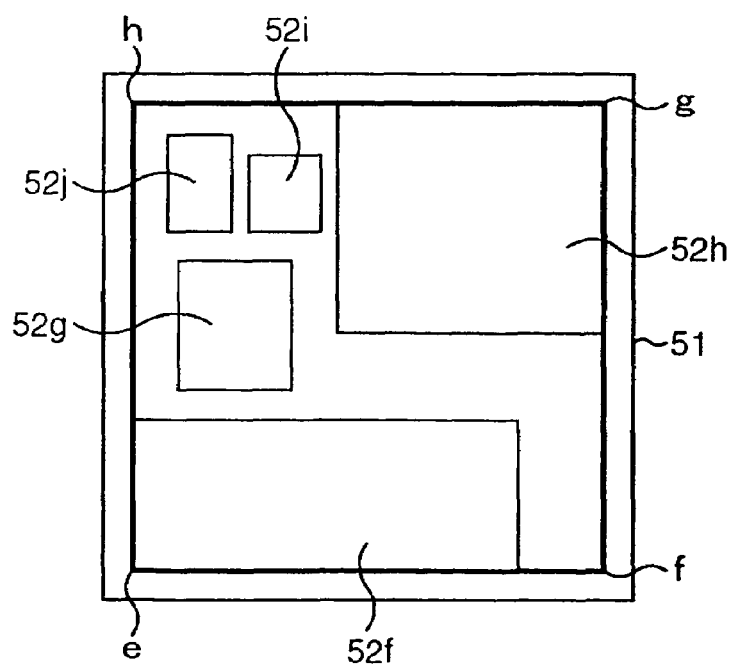

Incidentally, in each of the examples shown in FIGS. 3A and 3B, the dummy patterns (sub-patterns) may be formed across the whole region except the pattern-dense regions 52a to 52e or the pattern-dense regions 52f to 52j in a square region surrounded by the scribe line 51.

Specific Embodiments of the Present Invention

Next, specific embodiments of the present invention will be explained with reference to the attached drawings.

First Embodiment

Figure 4:
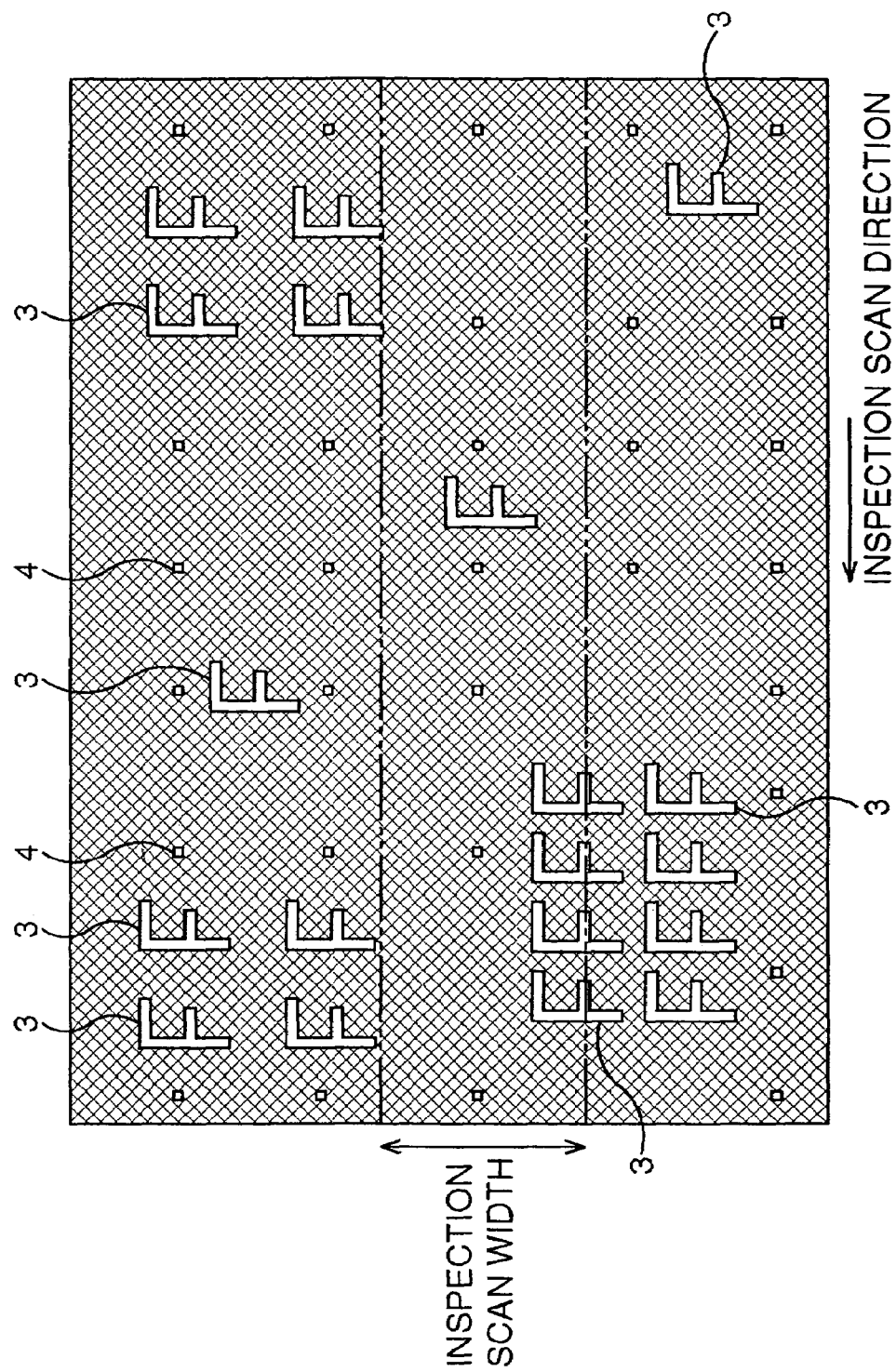
FIG. 4 is a schematic diagram showing a photomask according to a first embodiment of the present invention.

First, a first embodiment of the present invention will be explained. FIG. 4 is a schematic diagram showing a photomask according to the first embodiment of the present invention. A hatched region in FIG. 4 is a region shielded by a chrome film or the like.

The photomask according to the first embodiment is a photomask of a positive image, in which opening patterns 3 of an F-letter shape are selectively formed. However, if only these opening patterns 3 are formed, a part of any of the opening patterns 3 is constantly included in the scan target range of the mask pattern defect inspecting apparatus in a region where the opening patterns 3 are comparatively densely arranged while the scan target range which does not include any part of the opening patterns 3 exists in other regions.

In this embodiment, rectangular opening dummy patterns 4 are formed interspersedly in the scan target range which does not include any part of the opening patterns 3 in the minimum rectangular region. On this occasion, the dummy patterns 4 are arranged in a manner that at least a part of the opening patterns 3 or the dummy patterns 4 is included in any scan target range scanned by the pattern defect inspecting apparatus.

Further, the dummy patterns 4 have such size that the dummy patterns 4 themselves are not transferred to photosensitive material formed on a substrate, similarly to that of the dummy patterns 2 shown in FIG. 1.

With such a photomask according to the first embodiment, any pattern absolutely exists when one scan target range is scanned by the mask pattern defect inspecting apparatus, and mix-up of alignment does not occur. Therefore, the dummy defect which has conventionally occurred can be prevented from occurring. Further, since the dummy patterns 4 are not transferred to the photosensitive material, patterns transferred to the photosensitive material are not affected by the dummy patterns 4.

Second Embodiment

Next, a second embodiment of the present invention will be explained. FIG. 5 is a schematic diagram showing a photomask according to the second embodiment of the present invention. Hatched regions in FIG. 5 are regions shielded by a chrome film or the like.

The photomask according to the second embodiment is a photomask of a negative image, in which shielded patterns 5 having an F-letter shape are selectively formed. However, if only these shielded patterns 5 are formed, a part of any of the shielded patterns 5 is constantly included in the scan target range of the mask pattern defect inspecting apparatus in a region where the shielded patterns 5 are comparatively densely arranged while the scan target range which does not include any part of the shielded patterns 5 exists in other regions.

In this embodiment, linear shielded dummy patterns 6 are selectively formed in the scan target range which does not include any part of the shielded patterns 5 in the minimum rectangular region. On this occasion, the dummy patterns 6 are arranged in a manner that at least a part of the shielded patterns 5 or the dummy patterns 6 is included in any scan target range scanned by the mask pattern defect inspecting apparatus.

Further, the dummy patterns 6 have such width that the dummy patterns 6 themselves are not transferred to photosensitive material formed on a substrate.

Also according to the second embodiment as described above, the dummy defect which has conventionally occurred can be prevented from occurring. Furthermore, similarly to the dummy patterns 4, the dummy patterns 6 are not transferred to the photosensitive material and therefore patterns transferred to the photosensitive material are not affected by the dummy patterns 6.

Third Embodiment

Subsequently, a third embodiment of the present invention will be explained. The third embodiment relates to a photomask used for multiple exposure.

Figure 6A:
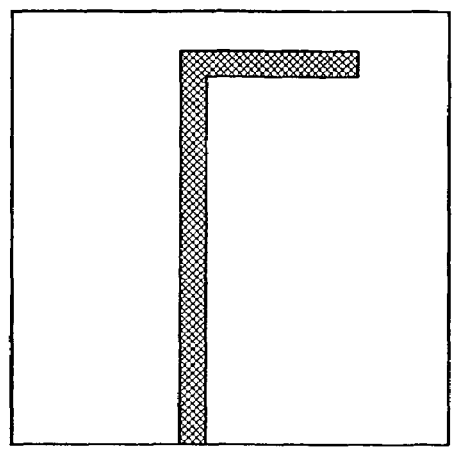
FIGS. 6A and 6B are schematic diagrams showing photomasks used for multiple exposure.
Figure 6B:
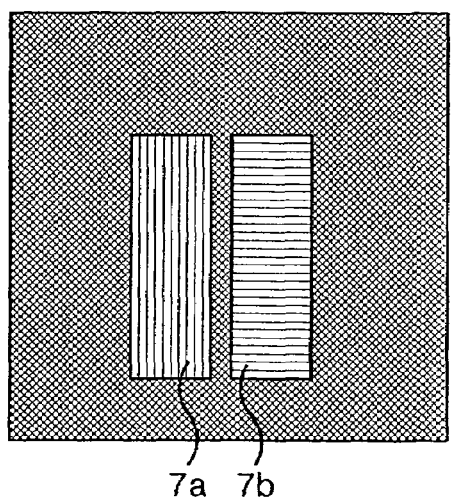

Here, the multiple exposure will be explained. In the multiple exposure, for example, exposure using a half-tone mask shown in FIG. 6A and exposure using a Levenson phase shift mask shown in FIG. 6B are performed for one layer photosensitive material. A pattern formed on the half-tone mask is, for example, for a gate and its wiring. Patterns formed on the Levenson phase shift mask are, for example, for narrowing the gate.

Figure 6C:
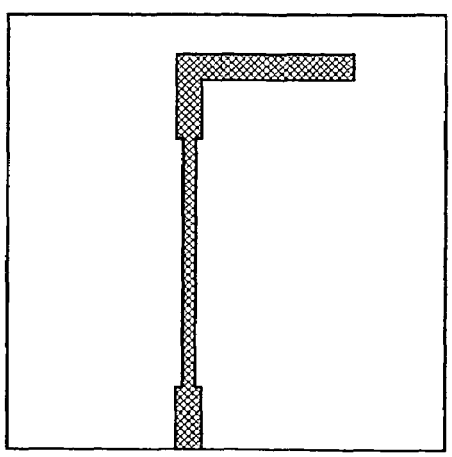
FIG. 6C is a schematic diagram showing a pattern formed on the photosensitive material by the multiple exposure.

As a result of the multiple exposure described above, as shown in FIG. 6C, a pattern whose width is locally narrowed is formed on the photosensitive material as compared with a pattern obtained by exposure only using the half-tone mask. Incidentally, a hatched region in FIG. 6A is shielded region. In FIG. 6B, a diagonally hatched region is a shielded region and both of a region filled with vertical lines and a region filled with horizontal lines are opening regions formed in a manner that phases of their transmitting light deviate from each other by π (180°). A hatched region in FIG. 6C is a region which is not exposed by any of the exposure.

Figure 7:
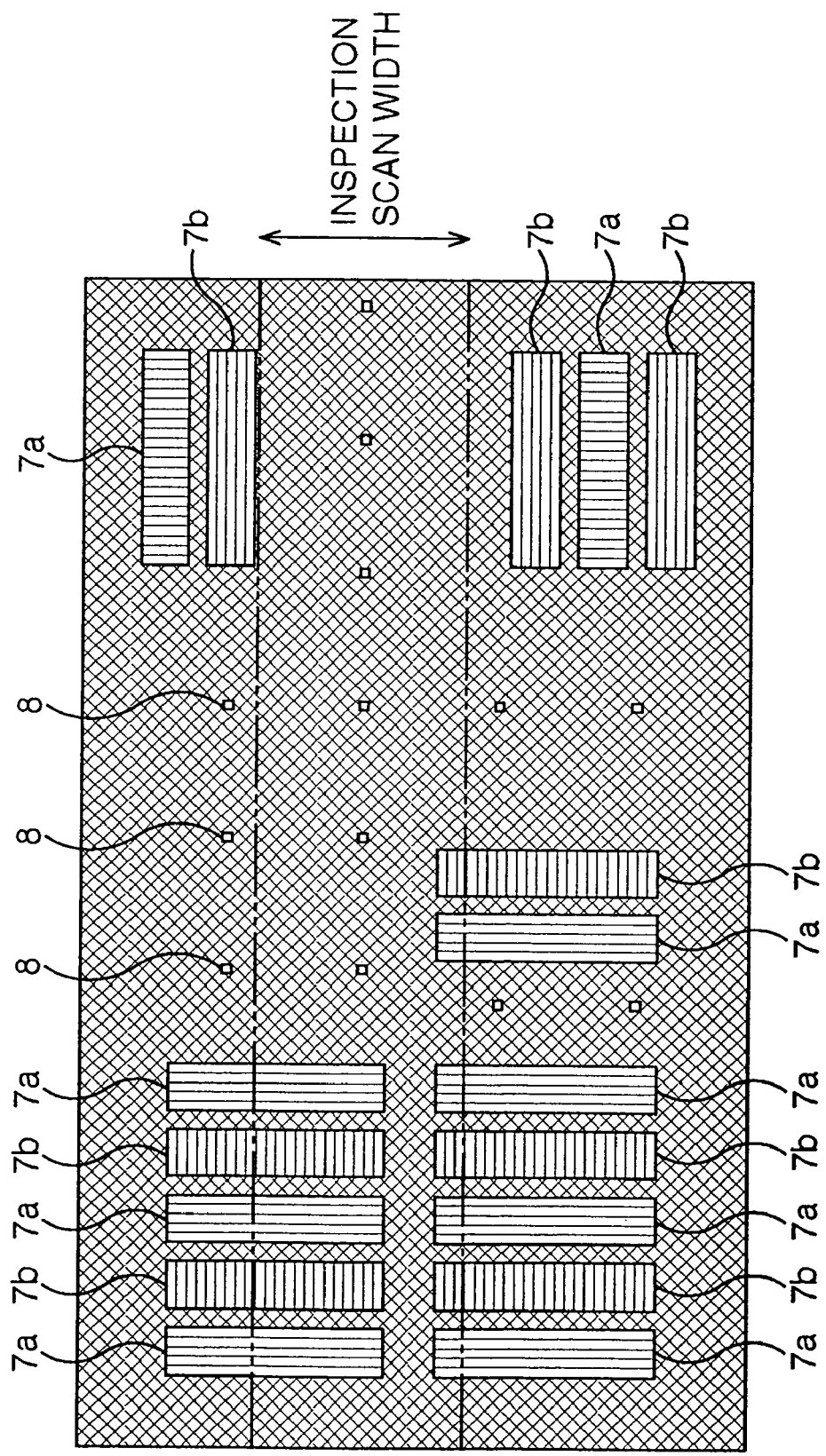
FIG. 7 is a schematic diagram showing a photomask according to a third embodiment of the present invention.

In the third embodiment, the present invention is applied to the Levenson phase shift mask out of the aforesaid photomasks used for the multiple exposure. FIG. 7 is a schematic diagram showing a photomask according to the third embodiment of the present invention. A diagonally hatched region in FIG. 7 is a region shielded by a chrome film or the like and both of regions filled with vertical lines and regions filled with horizontal lines are opening regions formed in a manner that phases of their transmitting light deviate from each other by π.

In the third embodiment, similarly to the Levenson phase shift mask shown in FIG. 6B, rectangular opening patterns (opening regions) 7a and 7b are selectively formed. Phases of transmitting light of the opening patterns 7a and the opening patterns 7b deviate by π (180°) However, since the Levenson phase shift mask in the multiple exposure is used for, for example, forming the gate electrode of a field effect transistor as described above, the opening patterns 7a and 7b have an extremely little proportion of the whole photomask and most part of the photomask is the shielded region. Therefore, the dummy defect occurs particularly easily. Further, if opening patterns formed on the photomask are only the opening patterns 7a and 7b to be transferred to the photosensitive material, the scan target range which does not include any part of the opening patterns 7a and 7b can exist, similarly to the first embodiment.

In this embodiment, rectangular dummy patterns 8 are formed interspersedly in the scan target range which does not include any part of the opening patterns 7a and 7b in the minimum rectangular region. On this occasion, the dummy patterns 8 are arranged in a manner that at Least a part of the opening patterns 7a or 7b or the dummy patterns 8 is included in any scan target range scanned by the mask pattern defect inspecting apparatus, similarly to the dummy patterns 4.

Further, the dummy patterns 8 have such size that the dummy patterns 8 themselves are not transferred to photosensitive material formed on a substrate.

According to the third embodiment as described above, the dummy defect which has conventionally occurred in the Levenson phase shift mask can be prevented from occurring. Further, similarly to the dummy patterns 4, the dummy patterns 8 are not transferred to the photosensitive material and therefore patterns transferred to the photosensitive material are not affected by the dummy patterns 8.

Incidentally, in these embodiments, in a case in which positions of the dummy patterns do not cause malfunctions such as short circuit and increase in parasitic capacitance over an allowable range when the dummy patterns are transferred to the photosensitive material, the dummy patterns may have the size larger than resolution limit in some cases. In other words, the dummy patterns do not necessarily have the size equal to or smaller than resolution constantly.

Fourth Embodiment

Figure 8A:
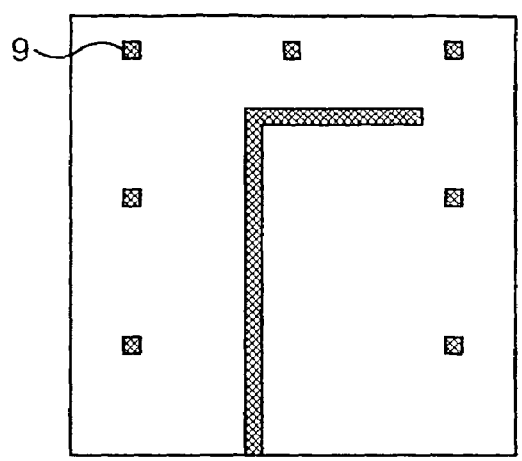
FIGS. 8A to 8C are schematic diagrams showing photomasks and a pattern formed on the photosensitive material according to a fourth embodiment of the present invention.
Figure 8B:
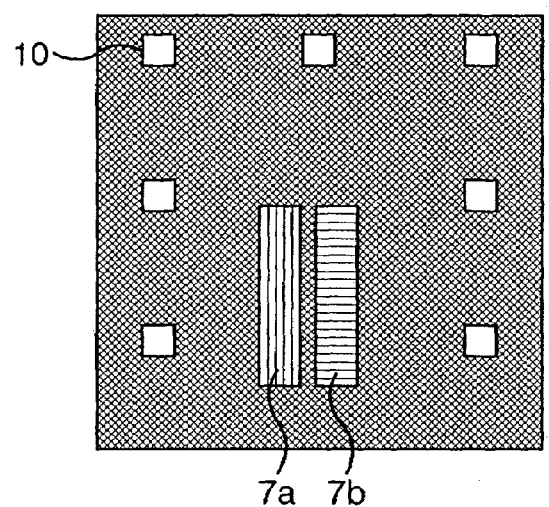
Figure 8C:
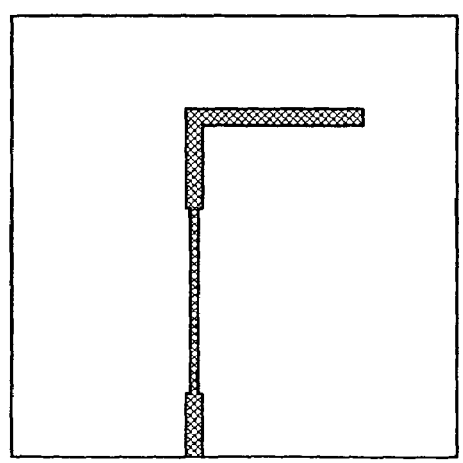

Next, a fourth embodiment of the present invention will be explained. The fourth embodiment also relates to the photomask used for the multiple exposure, but the dummy patterns are also formed on the half-tone mask in this embodiment. FIGS. 8A to 8C are schematic diagrams showing patterns formed on the photomask and photosensitive material according to the fourth embodiment of the present invention. Incidentally, hatched regions in FIG. 8A are shielded regions. In FIG. 8B, a diagonally hatched region is a shielded region and both of a region filled with vertical lines and a region filled with horizontal lines are opening regions formed in a manner that phases of their transmitting light deviate from each other by π. A hatched region in FIG. 8C is a region which is not exposed by any of the exposure.

In the fourth embodiment, dummy patterns 10 are formed on a Levenson phase shift mask shown in FIG. 8B and dummy patterns 9 are formed on a half-tone mask shown in FIG. 8A. Both of the dummy patterns 9 and 10 have a rectangular shape and the dummy patterns 9 have the size smaller than that of the dummy patterns 10. Furthermore, the dummy patterns 9 and 10 are arranged in a mariner that one dummy pattern 9 is absolutely included in one dummy pattern 10 when two photomasks on which these dummy patterns are formed are overlaid on the photosensitive material to transfer them while performing alignment. Moreover, the dummy patterns 9 and 10 have the same number. Similarly to the first to third embodiments, the dummy patterns 10 are arranged in a manner that at least a part of the opening patterns 7a or 7b or the dummy patterns 10 is included in any scan target range scanned by the mask pattern defect inspecting apparatus in the minimum rectangular region.

In this embodiment thus structured, the dummy pattern 9 may have the size transferred to the photosensitive material. This is because, even if the dummy patterns 9 are transferred to the photosensitive material, that is, even if regions of the photosensitive material matching with the dummy patterns 9 are not exposed, light is irradiated through the dummy patterns 10 to the regions in the subsequent exposure using the Levenson phase shift mask shown in FIG. 5B, and therefore a pattern finally transferred to the photosensitive material shown in FIG. 8C is not affected by the dummy patterns 9 and 10. In other words, it is because the dummy patterns 9 and 10 cancel effects on the photosensitive material of each other.

According to the fourth embodiment described above, the dummy defect which has conventionally occurred can be prevented from occurring in the Levenson phase shift mask and the half-tone mask.

Fifth Embodiment

Figure 9A:
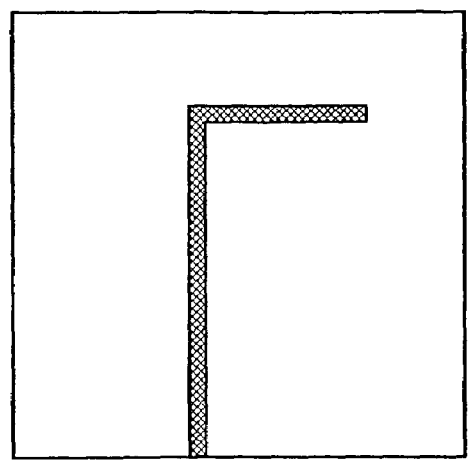
FIGS. 9A to 9C are schematic diagrams showing photomasks and a pattern formed on the photosensitive material according to a fifth embodiment of the present invention.
Figure 9B:
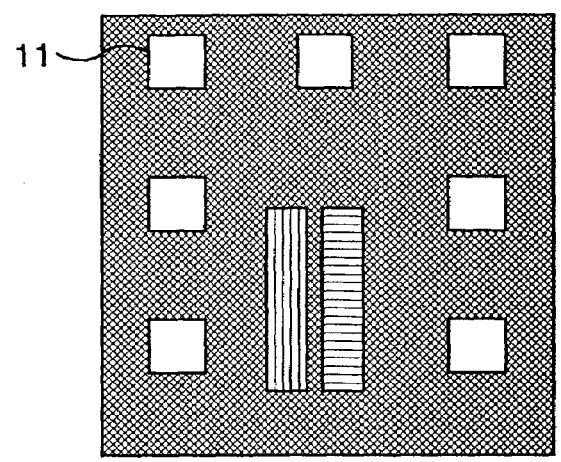
Figure 9C:
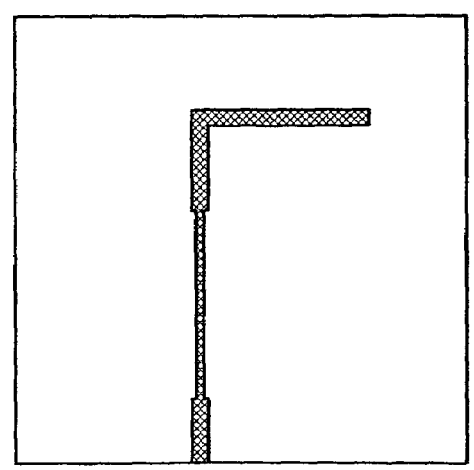

Subsequently, a fifth embodiment of the present invention will be explained. The fifth embodiment also relates to the photomask used for the multiple exposure, but the dummy patterns transferred to the photosensitive material are formed on the Levenson phase shift mask in this embodiment. FIGS. 9A to 9C are schematic diagrams showing patterns formed on the photomask and the photosensitive material according to the fifth embodiment of the present invention. Incidentally, a hatched region in FIG. 9A is a shielded region. In FIG. 9B, a diagonally hatched region is a shielded region and both of a region filled with vertical lines and a region filled with horizontal lines are opening regions formed in a manner that phases of their transmitting light deviate from each other by π. Further, a hatched region in FIG. 9C is a region which is not exposed by any of the exposure.

In this embodiment, dummy patterns 11 having the size transferred to the photosensitive material are arranged in a manner that at least a part of the opening patterns 7a or 7b or the dummy patterns 11 is included in any scan target range scanned by the mask pattern defect inspecting apparatus in the minimum rectangular region. However, the dummy patterns 11 are not formed in positions overlapping with the shielded pattern formed on the half-tone mask shown in FIG. 9A.

On the other hand, as shown in FIG. 9A, only a pattern for a gate and its wiring is formed on the half-tone mask.

In the fifth embodiment thus structured, the dummy patterns 11 have the size transferable to the photosensitive material while the positions where the dummy patterns 11 are formed are positions to which light is transmitted in exposure using the half-tone mask. Therefore, when exposure using the half-tone mask is first performed, the dummy patterns 11 are not transferred to the photosensitive material. When exposure using the Levenson phase shift mask is first performed, the dummy patterns 11 are temporarily transferred to the photosensitive material, but patterns formed by the dummy patterns 11 vanish by the subsequent exposure using the half-tone mask. Therefore, as shown in FIG. 9C, patterns of the dummy patterns 11 do not remain on the photosensitive material.

Figure 10:
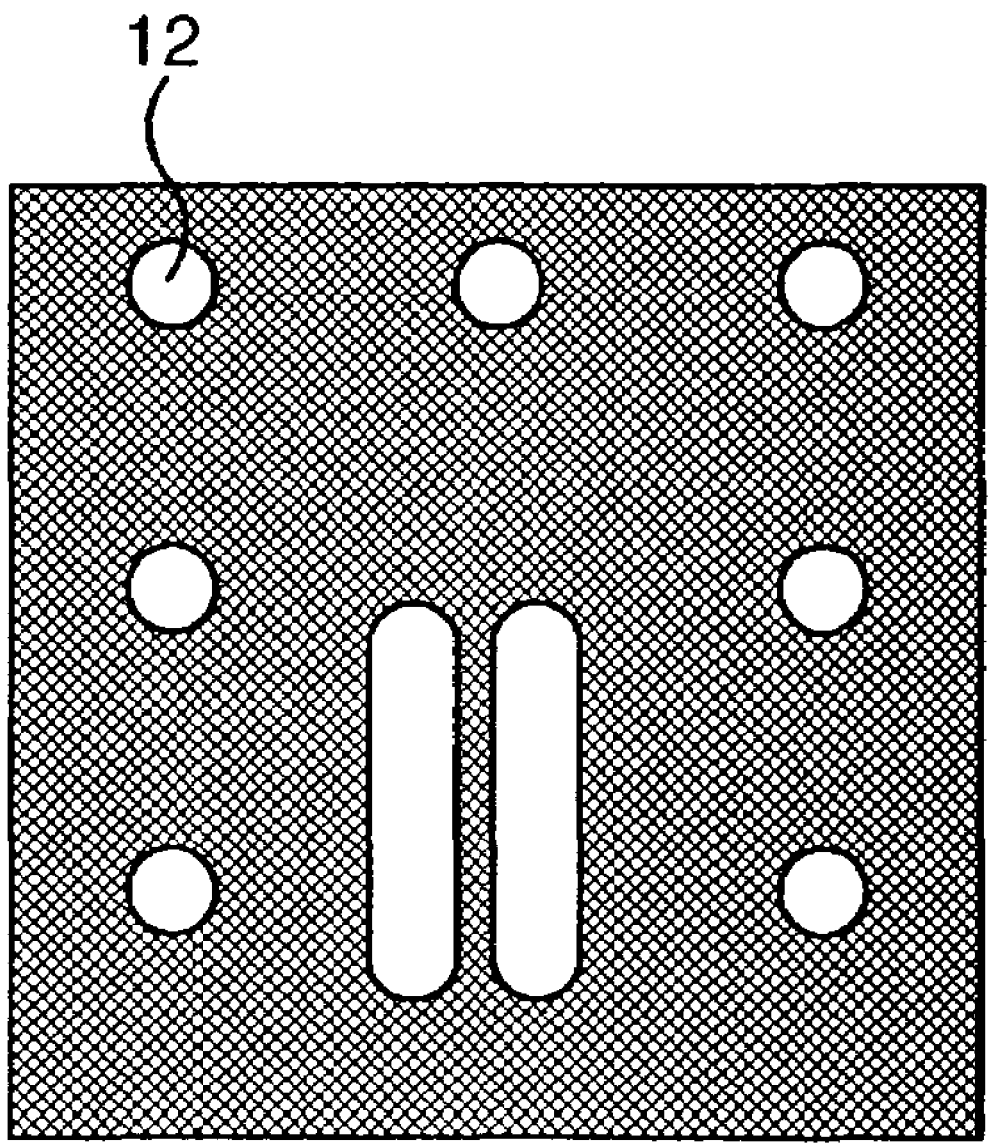
FIG. 10 is a schematic diagram showing a pattern formed on the photosensitive material by exposure using the photomask shown in FIG. 9B.

Incidentally, even if the dummy patterns 11 have the size transferred to the photosensitive material, their patterns do not remain on the photosensitive material and cause no trouble because the Levenson phase shift mask in the fifth embodiment is used for the multiple exposure. However, if the multiple exposure is not performed, the dummy patterns 11 are transferred to the photosensitive material and round exposed parts 12 are formed and remain as they are on the photosensitive material as shown in FIG. 10. Incidentally, a hatched region in FIG. 10 is a region not exposed by exposure.

Also according to the fifth embodiment, the dummy defect which has conventionally occurred can be prevented from occurring in the Levenson phase shift mask.

Sixth Embodiment

Figure 11A:
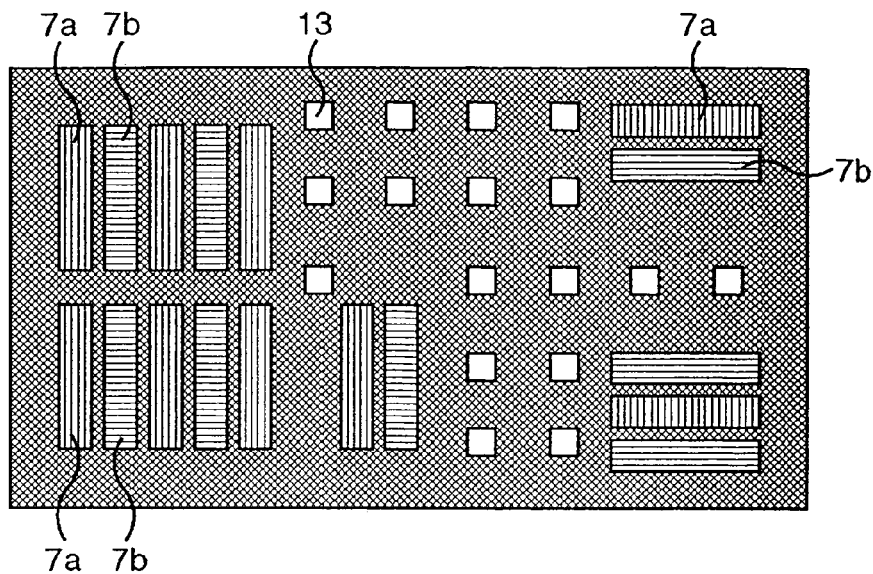
FIG. 11A is a schematic diagram showing a photomask according to a sixth embodiment of the present invention and FIG. 11B is a schematic diagram showing patterns formed by exposure using the photomask shown in FIG. 11A.
Figure 11B:
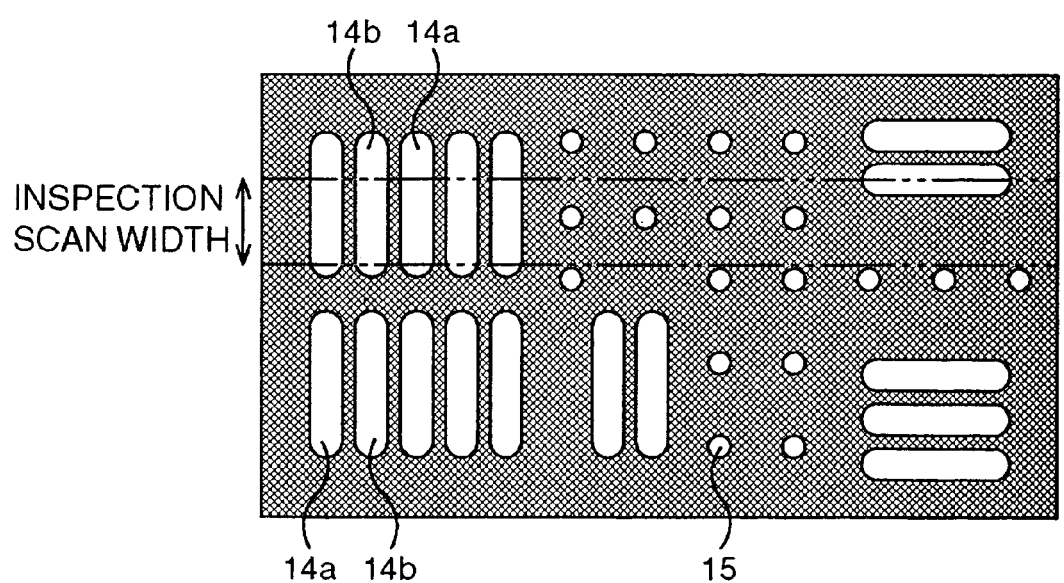

Next, a sixth embodiment of the present invention will be explained. The sixth embodiment is according to a photomask for narrowing the width of a gate in the multiple exposure, in which dummy patterns are intentionally transferred to photosensitive material as shown in FIG. 10. FIG. 11A is a schematic diagram showing the photomask according to the sixth embodiment of the present invention, and FIG. 11B is a schematic diagram showing patterns formed by exposure using the photomask shown in FIG. 11A. Incidentally, in FIG. 11A, a diagonally hatched region is a shielded region and both of regions filled with vertical lines and regions filled with horizontal lines are opening regions formed in a manner that phases of their transmitting light deviate from each other by π. Moreover, a hatched region in FIG. 11B is a region which is not exposed by any of the exposure.

The photomask according to this embodiment is, for example, a Levenson phase shift mask. Further, dummy patterns 13 having the size transferred to the photosensitive material are arranged in a manner that at least a part of patterns formed by transferring the opening patterns 7a or 7b or the dummy patterns 13 is included in any scan target range scanned by a photosensitive material pattern defect inspecting apparatus.

When exposure is performed using the photomask thus structured according to the sixth embodiment, exposed parts 14a or 14b formed by transferring the opening patterns 7a or 7b and exposed parts 15 formed by transferring the dummy patterns 13 are formed on the photosensitive material, as shown in FIG. 11B.

If one scan target range is scanned by the photosensitive material pattern defect inspecting apparatus for such a photosensitive material, at least a part of any pattern exists in the region and the dummy defect which has conventionally occurred can be prevented from occurring.

Further, the exposed parts 15 can be regarded as not having been formed by, for example, performing exposure using the half-tone mask shown in FIG. 6A afterwards. Therefore, it is extremely easy not to have effects of the exposed parts 15 on a photosensitive resist in developing the photosensitive resist.

As described above, according to the present invention, with the existence of the sub-patterns, it is possible to prevent mix-up of alignment in inspecting a defect and occurrence of dummy defect. Accordingly, reliable inspection of the defect in mask patterns can be performed.

What is claimed is:

1. A pattern defect detecting method for detecting a defect in main patterns formed on a photomask to be transferred to photosensitive material, comprising the step of:

scanning said photomask using a mask pattern defect inspecting apparatus, one or more sub-patterns being previously formed inside a rectangular region including all of said main patterns therein, in a manner that a part of at least one pattern selected from a group composed of said main patterns and said sub-patterns is included in a prescribed scan target range of said mask pattern defect inspecting apparatus at least in said rectangular region, wherein said scan target range is a range regulated by said mask pattern defect inspecting apparatus, in which data can be processed at one time in said mask pattern defect inspecting apparatus, wherein every scan target range in said rectangular region includes at least one of said main patterns and said sub-patterns, wherever said scan target range is in said rectangular region, wherein said sub-patterns are arranged at an interval narrower than a scanning width of said mask pattern defect inspecting apparatus in a direction perpendicular to a scanning direction and narrower than a length of said scan target range in said scanning direction.

2. The pattern defect detecting method according to claim 1, wherein said sub-patterns have the size smaller than the minimum size transferred to said photosensitive material.

3. The pattern defect detecting method according to claim 1,
wherein said photomask is used as one mask in multiple exposure.

4. The pattern defect detecting method according to claim 1,
wherein said one or more sub-patterns are formed inside a minimum rectangular region which has sides parallel to said scan direction of said mask pattern defect inspecting apparatus and has the smallest area in said rectangular region.

5. A pattern defect detecting method for detecting a defect in main patterns formed on a photomask used as one mask in multiple exposure, to be transferred to photosensitive material, comprising the step of:
scanning said photosensitive material using a photosensitive material pattern defect inspecting apparatus, one or more sub-patterns which have the size equal to or larger than the minimum size transferred to said photosensitive material being previously formed inside a rectangular region including all of said main patterns therein, in a manner that a part of a pattern made by transferring at least one pattern selected from a group composed of said main patterns and said sub-patterns is included in a prescribed scan target range of said photosensitive material pattern defect inspecting apparatus at least in said rectangular region,
wherein said scan target range is a range regulated by said mask pattern defect inspecting apparatus, in which data can be processed at one time in said mask pattern defect inspecting apparatus,
wherein every scan target range in said rectangular region includes at least one of said main patterns and said sub-patterns, wherever said scan target range is in said rectangular region,
wherein said sub-patterns are arranged at an interval narrower than a scanning width of said mask pattern defect inspecting apparatus in a direction perpendicular to a scanning direction and narrower than a length of said scan target range in said scanning direction.

6. The pattern defect detecting method according to claim 5,
wherein patterns made by transferring said sub-patterns to said photosensitive material vanish by exposure using another photomask in the multiple exposure.

7. The pattern defect detecting method according to claim 5,
wherein said photomask is a Levenson phase shift mask.

8. The pattern defect detecting method according to claim 5,
wherein said one or more sub-patterns are formed inside a minimum rectangular region which has sides parallel to said scan direction of said photosensitive material pattern defect inspecting apparatus and has the smallest area in said rectangular region.

9. A pattern making method using a photomask formed with main patterns to be transferred to photosensitive material, comprising the step of:
exposing said photosensitive material using said photomask so that said main patterns are transferred to said photosensitive material, one or more sub-patterns being previously formed inside a rectangular region including all of said main patterns therein, in a manner that a part of at least one pattern selected from a group composed of said main patterns and said sub-patterns is included in a prescribed scan target range of a mask pattern defect inspecting apparatus used for inspecting patterns on said photomask at least in said rectangular region,
wherein said scan target range is a range regulated by said mask pattern defect inspecting apparatus, in which data can be processed at one time in said mask pattern defect inspecting apparatus,
wherein every scan target range in said rectangular region includes at least one of said main patterns and said sub-patterns, wherever said scan target range is in said rectangular region,
wherein said sub-patterns are arranged at an interval narrower than a scanning width of said mask pattern defect inspecting apparatus in a direction perpendicular to a scanning direction and narrower than a length of said scan target range in said scanning direction.

10. The pattern making method according to claim 9,
wherein said sub-patterns have the size smaller than the minimum size transferred to said photosensitive material.

11. The pattern making method according to claim 9,
wherein said photomask is used as one mask in multiple exposure.

12. The pattern making method according to claim 9,
wherein said one or more sub-patterns are formed inside a minimum rectangular region which has sides parallel to said scan direction of said mask pattern defect inspecting apparatus and has the smallest area in said rectangular region.

13. A pattern making method by multiple exposure using a photomask formed with main patterns to be transferred to photosensitive material, comprising the step of:
exposing said photosensitive material using said photomask so that said main patterns and said sub-patterns are transferred to said photosensitive material, one or more sub-patterns which have the size equal to or larger than the minimum size transferred to said photosensitive material being previously formed inside a rectangular region including all of said main patterns therein, in a manner that a part of a pattern made by transferring at least one pattern selected from a group composed of said main patterns and said sub-patterns is included in a prescribed scan target range of a photosensitive material pattern defect inspecting apparatus used for inspecting patterns made on said photosensitive material at least in said rectangular region,
wherein said scan target range is a range regulated by said mask pattern defect inspecting apparatus, in which data can be processed at one time in said mask pattern defect inspecting apparatus,
wherein every scan target range in said rectangular region includes at least one of said main patterns and said sub-patterns, wherever said scan target range is in said rectangular region,
wherein said sub-patterns are arranged at an interval narrower than a scanning width of said mask pattern defect inspecting apparatus in a direction perpendicular to a scanning direction and narrower than a length of said scan target range in said scanning direction.

14. The pattern making method according to claim 13, further comprising the step of:
having patterns made by transferring said sub-patterns to said photosensitive material vanish by exposure using another photomask in the multiple exposure.

15. The pattern making method according to claim 13,
wherein said photomask is a Levenson phase shift mask.

16. The pattern making method according to claim 13,
wherein said one or more sub-patterns are formed inside a minimum rectangular region which has sides parallel to said scan direction of said photosensitive material pattern defect inspecting apparatus and has the smallest area in said rectangular region.

17. A pattern making method by multiple exposure for exposing the same photosensitive material using first and second masks, comprising the steps of:
exposing said photosensitive material using said first mask so that first main patterns and one or more first sub-patterns are transferred to said photosensitive material, said first main patterns to be transferred to said photosensitive material and first sub-patterns arranged inside a first rectangular region which includes all of said first main patterns therein being previously formed on said first mask, in a manner that a part of at least one pattern selected from a group composed of said first main patterns and said first sub-patterns is included in a prescribed scan target range of a photosensitive material pattern defect inspecting apparatus which is used for inspecting patterns made on said photosensitive material at least in said first rectangular region; and
exposing said photosensitive material using said second mask so that second main patterns are transferred to said photosensitive material and patterns made by transferring said first sub-patterns vanish, said second main patterns to be transferred to said photosensitive material and one or more second sub-patterns arranged inside a second rectangular region which includes all of said second main patterns therein being previously formed on said second mask, in a manner that a part of at least one pattern selected from a group composed of said second main patterns and said second sub-patterns is included in the prescribed scan target range of said photosensitive material pattern defect inspecting apparatus at least in said second rectangular region, and further, patterns made on said photosensitive material by transferring said first sub-patterns are canceled.

18. The pattern making method according to claim 17,
wherein said first mask is a Levenson phase shift mask and said second mask is a half-tone mask.

19. The pattern making method according to claim 17, further comprising the step of:
scanning said photosensitive material using said photosensitive material pattern defect inspecting apparatus, between the step of exposing said photosensitive material using said first mask and the step of exposing said photosensitive material using said second mask.

20. The pattern making method according to claim 17,
wherein said one or more first sub-patterns are formed inside a first minimum rectangular region which has sides parallel to a scan direction of said photosensitive material pattern defect inspecting apparatus and has the smallest area in said first rectangular region, and
wherein said one or more second sub-patterns are formed inside a second minimum rectangular region which has sides parallel to the scan direction of said photosensitive material pattern defect inspecting apparatus and has the smallest area in said second rectangular region.

* * * * *